(12) United States Patent
Roh et al.

(10) Patent No.: US 7,368,771 B2
(45) Date of Patent: May 6, 2008

(54) CMOS IMAGE SENSOR AND METHOD OF FABRICATING THE SAME

(75) Inventors: Jae-Seob Roh, Anyang-si (KR); Seok-Ha Lee, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 43 days.

(21) Appl. No.: 11/377,033

(22) Filed: Mar. 16, 2006

(65) Prior Publication Data
US 2006/0226339 A1 Oct. 12, 2006

(30) Foreign Application Priority Data
Apr. 11, 2005 (KR) .................. 10-2005-0029953

(51) Int. Cl.
*H01L 31/062* (2006.01)
(52) U.S. Cl. .............. 257/291; 257/E27.133; 438/75
(58) Field of Classification Search ........ 257/290–292, 257/E27.133, 258, 444, E27.128; 438/48, 438/57, 90, 199, 60, 66
See application file for complete search history.

(56) References Cited
U.S. PATENT DOCUMENTS
6,084,259 A * 7/2000 Kwon et al. .............. 257/292
6,180,969 B1 * 1/2001 Yang et al. ............... 257/291
6,218,691 B1 * 4/2001 Chung et al. ............. 257/290
2004/0053436 A1 3/2004 Rhodes FOREIGN PATENT DOCUMENTS
| JP | 11-075114 | 3/1999 |
| KR | 10-2000-0057865 | 9/2000 |
| KR | 1020030042303 A | 5/2003 |
| KR | 1020040095910 A | 11/2004 |

* cited by examiner

Primary Examiner—Brook Kebede
(74) Attorney, Agent, or Firm—F.Chau & Associates, LLC

(57) ABSTRACT

Provided are a complementary metal oxide semiconductor (CMOS) image sensor and a method of fabricating the same, where the CMOS image sensor includes a photodiode, a drive transistor, a reset transistor, and a selection transistor; the drive transistor includes a threshold voltage adjustment region doped with impurities of a type substantially identical to that of impurities doped into a source and a drain of the drive transistor; and the CMOS image sensor includes pixels with expanded output signal ranges.

22 Claims, 8 Drawing Sheets

CMOS IMAGE SENSOR AND METHOD OF FABRICATING THE SAME

CROSS-REFERENCE TO RELATED APPLICATION

This application claims foreign priority under 35 U.S.C. § 119 to Korean Patent Application No. 10-2005-0029953, filed on Apr. 11, 2005, in the Korean Intellectual Property Office, which is herein incorporated by reference in its entirety.

BACKGROUND OF THE INVENTION

1. Field of the Invention

The present disclosure relates to image sensors using semiconductor substrates, and more particularly, to complementary metal oxide semiconductor (CMOS) image sensors having photodiodes.

2. Description of the Related Art

Image sensors are semiconductor devices that convert optical images into electrical signals. In particular, complementary metal-oxide semiconductor (CMOS) image sensors include photodiodes that receive and store optical signals and form images using control devices that control or process the optical signals. Control devices can be fabricated using CMOS fabrication technology. Therefore, a process of fabricating CMOS image sensors can be realized, and a plurality of signal processing devices can be integrated onto a single chip.

Drawbacks and disadvantages of conventional CMOS image sensors will now be described with reference to FIG. 1. Referring to FIG. 1, a unit pixel of a conventional CMOS image sensor includes a photodiode 185, a transfer transistor 188, a reset transistor 158, a drive transistor 168, and a selection transistor 178.

The photodiode 185 receives optical energy and generates electric charges accordingly. The transfer transistor 188 may control the transmission of the generated electric charges to a floating node 190 using a transfer gate line TG. The reset transistor 158 may control a supply voltage $V_{dd}$ using a reset gate line RS and reset the potential of the floating node 190. The drive transistor 168 may function as a source follower amplifier. The selection transistor 178 is a switching device that can select a unit pixel using a selection gate line SEL.

The supply voltage $V_{dd}$ may be output to an output line OUT via the drive transistor 168 and the selection transistor 178. The drive transistor 168 may be controlled by the potential of the floating node 190. When the reset transistor 158 is turned on (that is, when a reset operation is performed), the potential of the floating node 190 is proportional to the supply voltage $V_{dd}$ and inversely proportional to a voltage drop in the reset transistor 158.

To lower the potential of the floating node 190 during the reset operation, the reset transistor 158 may be formed as a depletion transistor. However, the drive transistor 168 and the selection transistor 178 constituting an output circuit may be formed as enhancement transistors in consideration of off-leakage current.

As the integration density of CMOS image sensors increases, pixel sizes are reduced, and operating voltage becomes lower. Accordingly, voltage that can be output from a pixel becomes lower, and an output signal range of the pixel is reduced as a result.

SUMMARY OF THE INVENTION

The present disclosure provides a complementary metal-oxide semiconductor (CMOS) image sensor that can expand an output signal range of a pixel. The present disclosure also provides a method of fabricating a CMOS image sensor that can expand an output signal range of a pixel.

According to an aspect of the present disclosure, there is provided a CMOS image sensor including: a photodiode formed in a semiconductor substrate; a floating node formed in the semiconductor substrate and connected to the photodiode; a drive transistor including a gate formed on the semiconductor substrate and connected to the floating node, and a source and a drain doped with impurities of first conductivity, one of which is connected to a supply voltage; a reset transistor including a source and a drain formed in the semiconductor substrate and doped with the impurities of the first conductivity, one of which is connected to the floating node; and a selection transistor including a source and a drain formed in the semiconductor substrate and doped with the impurities of the first conductivity, one of which is connected to the source or drain of the drive transistor. The drive transistor includes a threshold voltage adjustment region doped with the impurities of the first conductivity in a portion of the semiconductor substrate where a channel is formed.

According to another aspect of the present disclosure, there is provided a CMOS image sensor including: a photodiode formed in a semiconductor substrate; a floating node formed in the semiconductor substrate and connected to the photodiode; a drive transistor including a gate formed on the semiconductor substrate and connected to the floating node, and a source and a drain doped with impurities of first conductivity; a reset transistor including a source and a drain formed in the semiconductor substrate and doped with the impurities of the first conductivity, one of which is connected to the floating node; and a selection transistor including a source and a drain formed in the semiconductor substrate and doped with the impurities of the first conductivity, one of which is connected to the source or drain of the drive transistor and the other of which is connected to a supply voltage. The drive transistor includes a threshold voltage adjustment region doped with the impurities of the first conductivity in a portion of the semiconductor substrate where a channel is formed.

According to another aspect of the present disclosure, there is provided a method of fabricating a CMOS image sensor, the method including: forming a device isolation region defining an active region in a semiconductor substrate; forming a first threshold voltage adjustment region in a first portion of the active region, forming a second threshold voltage adjustment region in a second portion of the active region, and forming a third threshold voltage adjustment region in a third portion of the active region; and forming a reset gate on the first portion, forming a drive gate on the second portion, and forming a selection gate on the third portion. The first and second threshold voltage adjustment regions are simultaneously formed.

The first, second, and third threshold voltage adjustment regions may be simultaneously formed. After a photoresist pattern exposing the first, second, and third portions of the active region is formed, the impurities of the first conductivity may be ion-implanted into the entire surface of the resulting structure having the photoresist using the photoresist pattern as a protective layer to form the first, second, and third threshold voltage adjustment regions. A deep second conductive well may be formed in the active region before the first threshold voltage adjustment region is formed.

BRIEF DESCRIPTION OF THE DRAWINGS

The above and other features and advantages of the present disclosure will become more apparent by describing in detail exemplary embodiments thereof with reference to the attached drawings, in which.

DETAILED DESCRIPTION OF PREFERRED EMBODIMENTS

Figure 1:
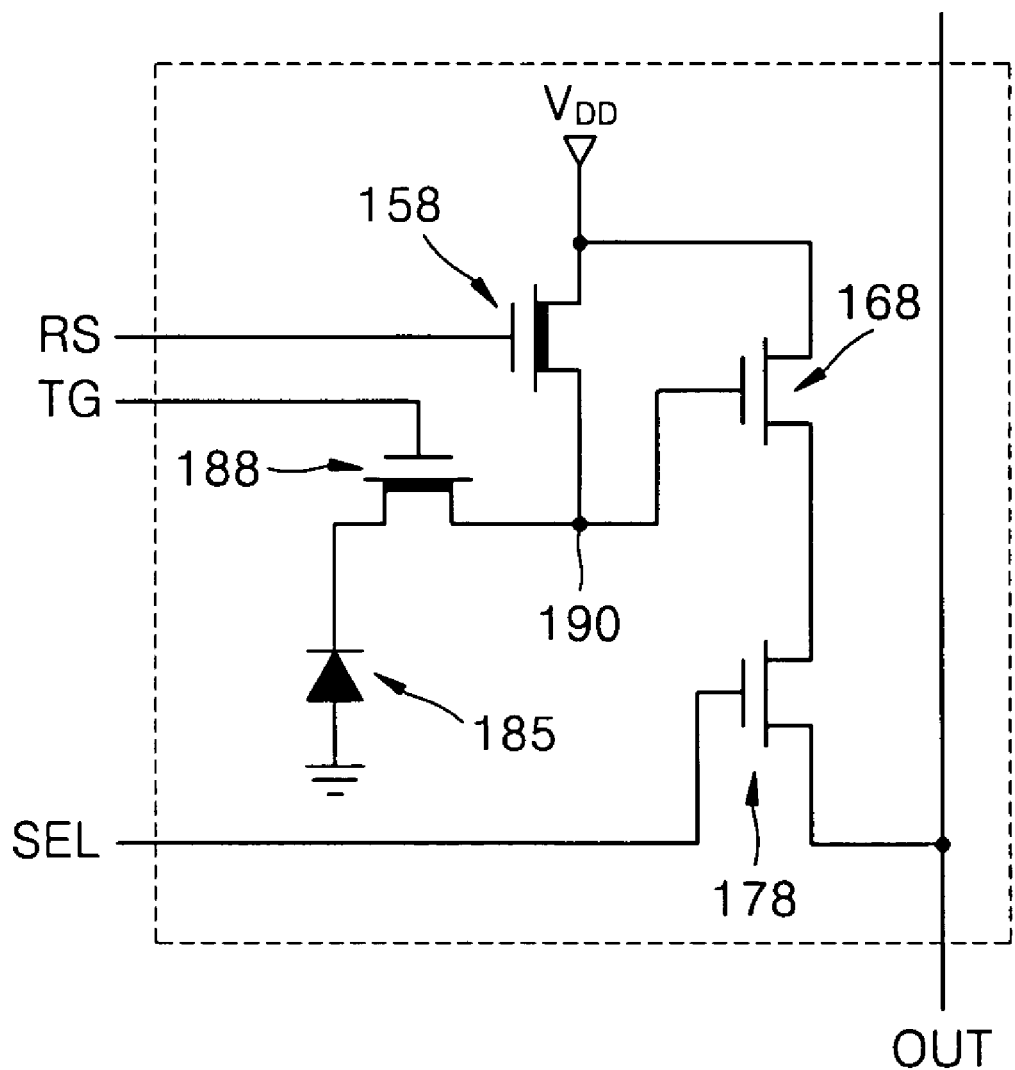
FIG. 1 is a circuit diagram of a unit pixel of a conventional complementary metal-oxide semiconductor (CMOS) image sensor.

The present disclosure will now be described more fully with reference to the accompanying drawings, in which exemplary embodiments are shown. The invention may, however, be embodied in many different forms and should not be construed as being limited to the embodiments set forth therein; rather, these embodiments are provided so that this disclosure will be thorough and complete, and will fully convey the concept of the invention to those skilled in the art. In the drawings, the thickness of layers and regions may be exaggerated for clarity.

Figure 2:
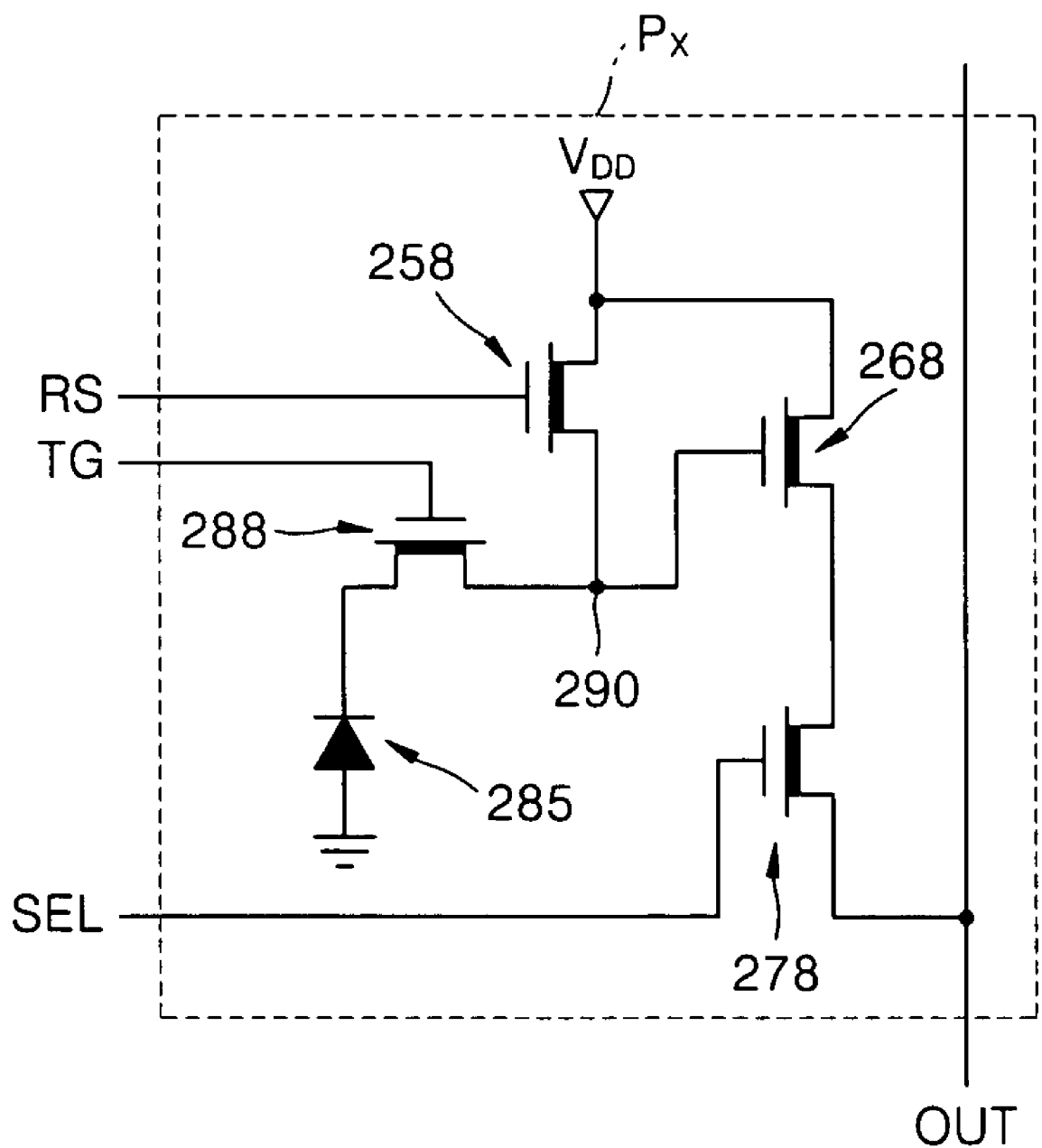
FIG. 2 is a circuit diagram of a unit pixel of a CMOS image sensor according to an embodiment of the present disclosure.

A complementary metal-oxide semiconductor (CMOS) image sensor according to an embodiment of the present disclosure may include an array of pixels. Referring to FIG. 2, a unit pixel Px of the CMOS image sensor includes a photodiode 285, a transfer transistor 288, a reset transistor 258, a drive transistor 268, and a selection transistor 278.

The photodiode 285 may receive optical energy and generate electric charges accordingly. The transfer transistor 288 may control the transmission of the generated electric charges to a floating node 290 using a transfer gate line TG. The reset transistor 258 may control a supply voltage $V_{dd}$ using a reset gate line RS and thus reset potential of the floating node 290. The drive transistor 268 may function as a source follower amplifier. The selection transistor 278 is a switching device that can select the unit pixel Px using a selection gate line SEL.

The supply voltage $V_{dd}$ may be output to an output line OUT via the drive transistor 268 and the selection transistor 278. The drive transistor 268 may be controlled by the potential of the floating node 290. An output voltage $V_{out}$ may be defined by the supply voltage $V_{dd}$ and a threshold voltage $V_{th,d}$ of the drive transistor 268 as:

$$V_{out} = V_{dd} - V_{th,d} \quad (1)$$

Therefore, it can be seen that the output voltage $V_{out}$ increases as the supply voltage $V_{dd}$ becomes higher and the threshold voltage $V_{th,d}$ becomes lower. In other words, the drive transistor 268 may be formed as a depletion transistor having the threshold voltage $V_{th,d}$ close to zero when a substrate bias voltage is not present. In this case, since an output voltage $V_{out}$ close to the supply voltage $V_{dd}$ can be obtained, an output signal range of the unit pixel Px can be expanded. The substrate bias voltage of the drive transistor 268 may also be controlled to drive the drive transistor 268 in an enhanced mode.

In addition, the reset transistor 258 and the selection transistor 278 may be formed as depletion transistors. Specifically, the reset transistor 258 may be formed as a depletion transistor to reduce a drop in the supply voltage $V_{dd}$. The selection transistor 278 may also be formed as a depletion transistor to be consistent with the reset transistor 258 and the drive transistor 268. Therefore, if the reset transistor 258, the drive transistor 268, and the selection transistor 279 are all formed as depletion transistors having the same threshold voltage $V_{th,d}$, the output signal of the unit pixel Px can be expanded and a fabrication cost of the CMOS image sensor can be reduced.

Figure 3:
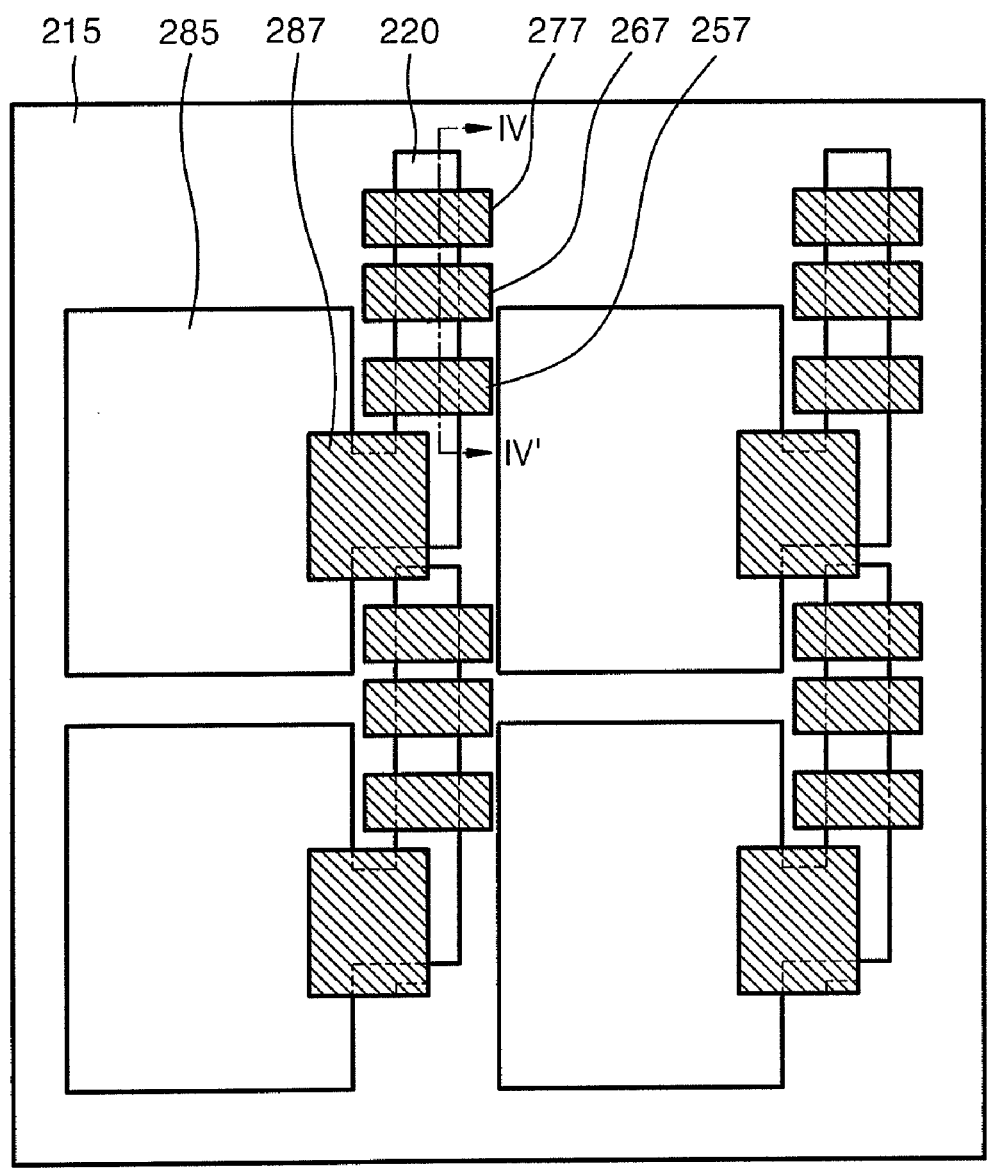
FIG. 3 is a plan view of the CMOS image sensor of FIG. 2.

The CMOS image sensor according to an embodiment of the present disclosure will now be described in more detail with reference to FIGS. 3 and 4. Referring to FIG. 3, the CMOS image sensor includes a plurality of photodiodes 285 arranged in an array of rows and columns, and gates of the transfer transistors 288 (hereinafter referred to as transfer gates 287), gates of the reset transistors 258 (hereinafter referred to as reset gates 257), gates of the drive transistor 268 (hereinafter referred to as drive gates 267) and gates of the selection transistor 278 (hereinafter referred to as selection gates 277) for controlling the photodiodes 285, respectively. The pixels include the photodiodes 285, the transfer gates 287, the reset gates 257, the drive gates 267 and the selection gates 277 formed in active regions 220 connected to the photodiodes 285, respectively. The pixels may each have the same structure.

Figure 4:
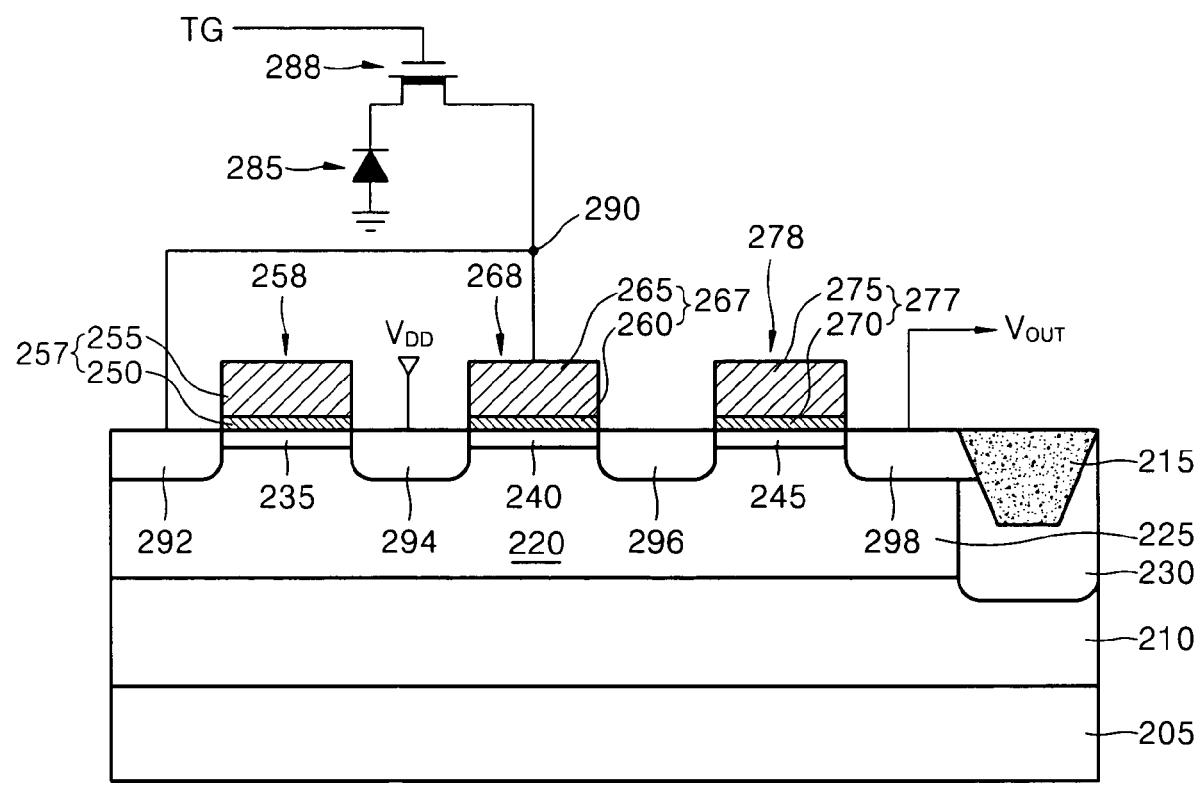
FIG. 4 is a cross-sectional view of the CMOS image sensor taken along line IV-IV' of FIG. 3.

Each of the photodiodes 285 is formed in a portion of the active region 220 defined by a device isolation region 215 on a semiconductor substrate 205, as illustrated in FIG. 4. The photodiode 285 may have a conventional structure known to those of ordinary skill in the pertinent art. For example, the photodiode 285 may have an n-type impurity doping region and a p-type impurity doping region formed on the n-type impurity doping region.

A cross-sectional structure of the reset transistor 258, the drive transistor 268, and the selection transistor 278 formed on the semiconductor substrate 205 will now be described with reference to FIG. 4. The reset transistor 258, the drive transistor 268, and the selection transistor 278 may be n-type metal oxide semiconductor (NMOS) transistors.

The semiconductor substrate 205 may be formed of n-type silicon, and, if so, a deep p-type well 210 forming a deep conductive passage may be formed under the active region 220. The device isolation region 215 may be surrounded by a channel stop region 230. The channel stop region 230 may be a p-type impurity doping region and may contact the deep p-type well 210. The active region 220 on the deep p-type well 210 may be a p-type well 225 doped with p-type impurities. The p-type impurities may be boron (B) or BF2, for example.

A drain 294 of the reset transistor 258 is formed in the active region 220 and connected to the supply voltage $V_{dd}$, and a source 292 of the reset transistor 258 is connected to the floating node 290. The drive transistor 268 shares the drain 294 with the reset transistor 258, and a source 296 with the selection transistor 278. A drain 298 of the selection transistor 278 is connected to the output voltage $V_{out}$. The sources 292 and 296 and the drains 294 and 298 may be doped with n-type impurities. The sources 292 and 296 and the drains 294 and 298 of the reset transistor 258, the drive transistor 268, and the selection transistor 278 are distinguished for convenience, but may be labeled oppositely.

The reset gate 257, the drive gate 267, and the selection gate 277 include gate insulating films 250, 260 and 270, and gate electrodes 255, 265 and 275, respectively. The gate insulating films 250, 260, and 270 may be formed of identical material. For example, the gate insulating films 250, 260, and 270 may be silicon oxide films or silicon nitride films. The gate electrodes 255, 265, and 275 may be formed of identical material. For example, the gate electrodes 255, 265, and 275 may be formed of polysilicon, tungsten (W), titanium nitride (TiN), tantalum (Ta) or tantalum nitride (TaN), or a combination of the same.

A first threshold voltage adjustment region 235 may be formed in a portion of the active region 220 under the reset gate 257 where a channel is formed, and a second threshold voltage adjustment region 240 may be formed in a portion of the active region 220 under the drive gate 267 where the channel is formed. Also, a third threshold voltage adjustment region 245 may be formed in a portion of the active region 220 under the selection gate 277 wherein the channel is formed.

The first, second, and third threshold voltage adjustment regions 235, 240, and 245 may be doped with n-type impurities. The n-type impurities may be arsenic (As) or phosphorous (P), for example. The first, second, and third threshold voltage adjustment regions 235, 240, and 245 may be doped with n-type impurities of equal concentration. Accordingly, the reset transistor 258, the drive transistor 268, and the selection transistor 278 may be formed to have the same threshold voltage $V_{th,d}$. If the doping density of the n-type impurities is adjusted, the reset transistor 258, the drive transistor 268, and the selection transistor 278 may become depletion transistors. In this case, the threshold voltages $V_{th,d}$ of the reset transistor 258, the drive transistor 268, and the selection transistor 278 are close to zero.

As described above, the output signal range can be expanded by lowering the threshold voltage $V_{th,d}$ of the drive transistor 268, and the voltage drop can be reduced by lowering the threshold voltage of the reset transistor 258.

Figure 5:
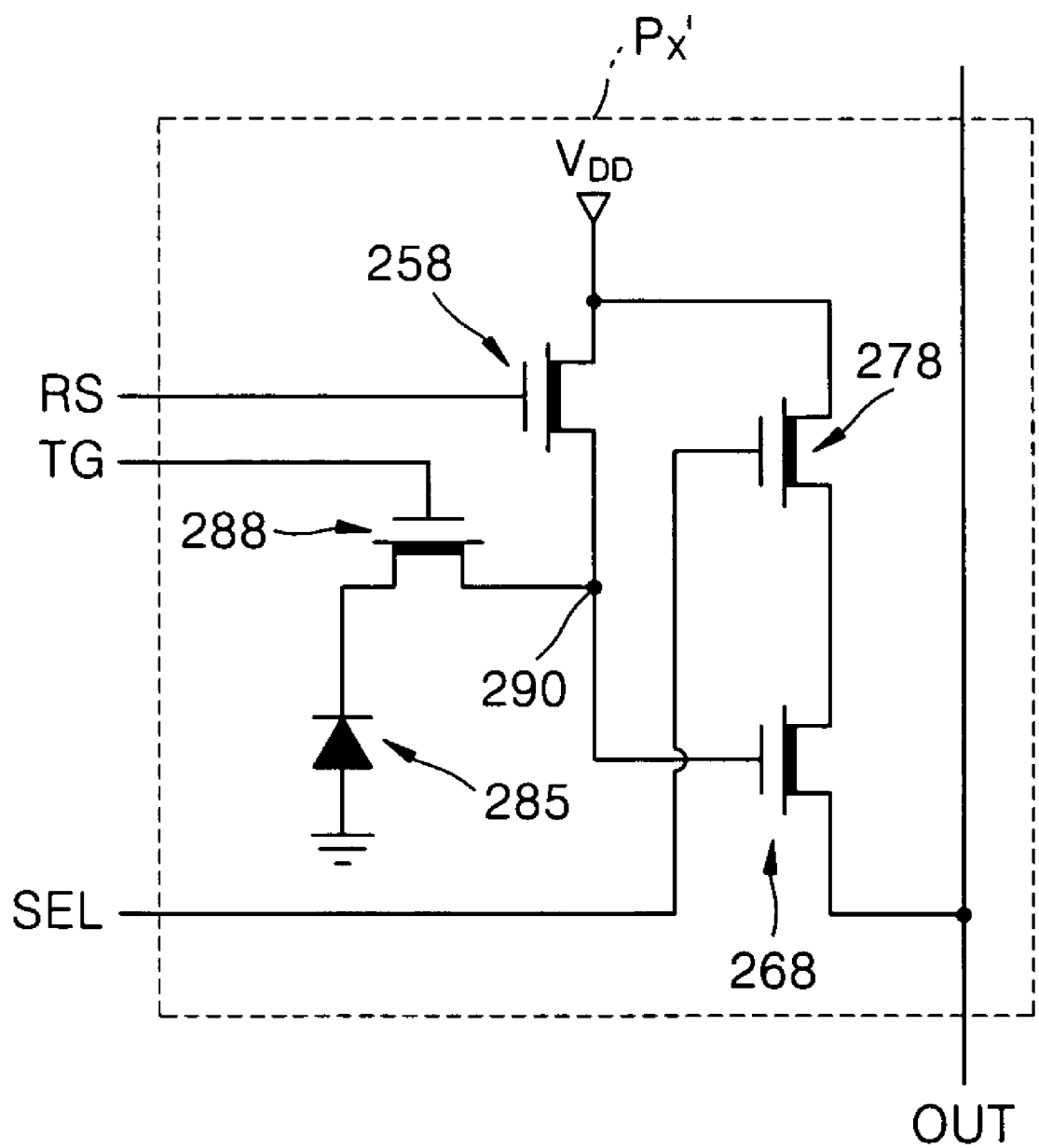
FIG. 5 is a circuit diagram of a unit pixel of a CMOS image sensor according to another embodiment of the present disclosure.
Figure 6:
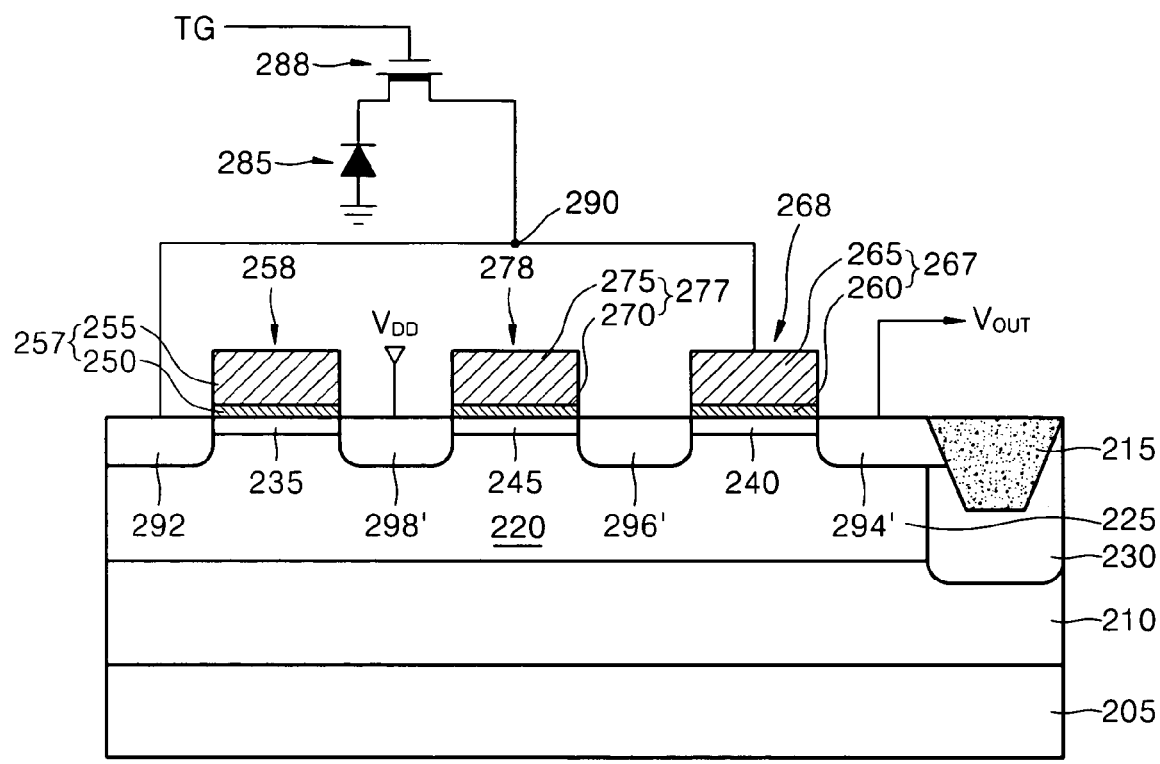
FIG. 6 is a cross-sectional view of the CMOS image sensor of FIG. 5.

A CMOS image sensor according to another embodiment of the present disclosure will now be described with reference to FIGS. 5 and 6. The CMOS image sensor of FIGS. 5 and 6 is similar to the image sensor of FIGS. 3 and 4, except for an arrangement order of the selection transistor 278 and the drive transistor 268. Therefore, the description and drawings of the CMOS image sensor of FIGS. 3 and 4 may be referred to for the description of the CMOS image sensor of FIGS. 5 and 6. Like reference numerals may denote like structures.

Referring to FIG. 5, a unit pixel Px' of the CMOS image sensor according to another embodiment of the present disclosure includes a photodiode 285, a transfer transistor 288, a reset transistor 258, a drive transistor 268, and a selection transistor 278. A supply voltage $V_{dd}$ may be output to an output line OUT via the selection transistor 278 and the drive transistor 268 sequentially. The drive transistor 268 may be controlled by the potential of a floating node 290. The structure of the unit pixel Px' and an array structure of the unit pixels Px' may be easily accomplished by those of ordinary skill in the pertinent art with reference to FIG. 3.

Referring to FIG. 6, a drain 298' of the reset transistor 258 is formed in an active region 220 and connected to the supply voltage $V_{dd}$, and a source 292 of the reset transistor 258 is connected to the floating node 290. The selection transistor 278 shares the drain 298' with the reset transistor 258 and a source 296' with the drive transistor 268. A drain 294' of the drive transistor 268 is connected to the output voltage $V_{out}$. The sources 292 and 296' and the drains 294' and 298' may be doped with n-type impurities. The sources 292 and 296' and the drains 294' and 298' of the reset transistor 258, the drive transistor 268, and the selection transistor 278 are distinguished for convenience, but may be labeled oppositely.

As described above, since the drain 298' of the selection transistor 278 is connected to the supply voltage $V_{dd}$, a voltage difference between the drain 298' or source 296' of the selection transistor 278 and a p-type well 225 in the active region 220 can be increased. Accordingly, the effects of a bias voltage applied to the selection transistor 278 can be obtained. Thus, the off properties of the selection transistor 278 can be enhanced by setting the threshold voltage of the selection transistor 278 to a value greater than zero during an actual output operation.

During the actual output operation, the drive transistor 268 can be set to have a threshold voltage $V_{th,d}$ close to or greater than zero. Therefore, even when first, second, and third threshold voltage adjustment regions 235, 240, and 245 are doped in the same concentration with n-type impurities, a signal output range can be expanded and the off properties of the selection transistor 278 can be secured.

A method of fabricating a CMOS image sensor according to an embodiment of the present disclosure will now be described with reference to FIGS. 7 through 11. FIGS. 2 through 6 can be referred to for the structure of the CMOS image sensor. Like reference numerals may denote like elements.

Figure 7:
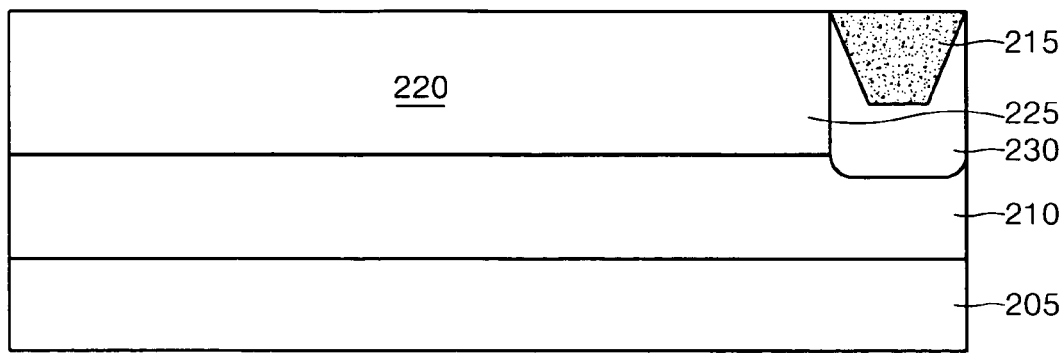
FIGS. 7 through 11 are cross-sectional views of a CMOS image sensor for illustrating a method of fabricating the CMOS image sensor according to an embodiment of the present disclosure.

Referring to FIG. 7, a deep p-type well 210 is formed in a semiconductor substrate 205. For example, boron (B) or BF2 may be doped deeply into the semiconductor substrate 205 using an ion implanter. Then, a device isolation region 215 is formed to define the active region 220. To form the device isolation region 215, a trench of a predetermined depth is formed, filled with an insulating layer, and planarized. The insulating layer may be a high-density plasma (HDP) oxide or an ozone oxide.

A p-type well 225 may be formed in the active region 220. Also, a channel stop region 230 contacting the deep p-type well 210 may be formed under the device isolation region 215. P-type impurities may be used to form the channel stop region 230.

Figure 8:
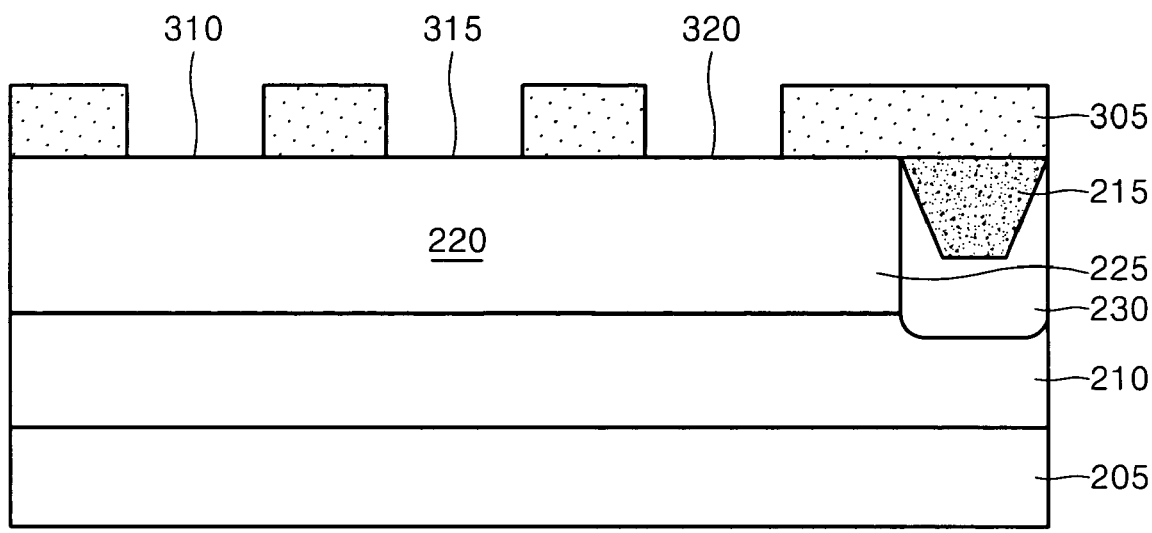

Referring to FIG. 8, a photoresist pattern 305 exposing first, second, and third portions 310, 315, and 320 of the active region 220 is formed. The photoresist pattern 305 may be formed using conventional photolithography.

Figure 9:
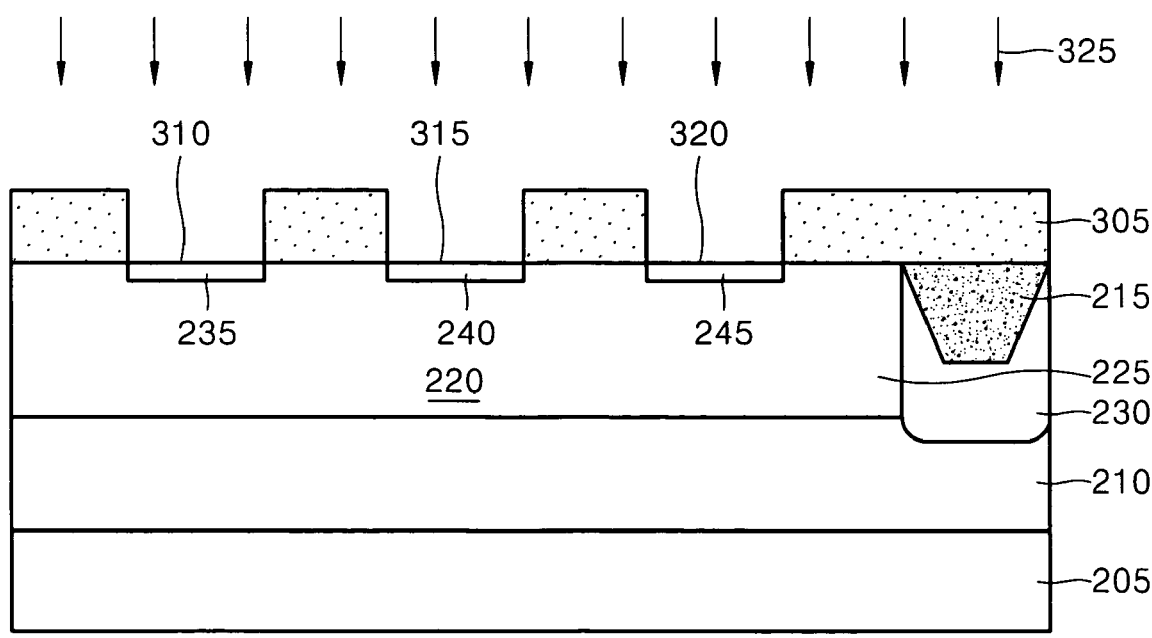

Referring to FIG. 9, using the photoresist pattern 305 as a protective layer for ion implantation, impurities of first conductivity 325 are ion-implanted into the entire surface of the resultant structure having the photoresist pattern 305. A first threshold voltage adjustment region 235 is formed in the first portion 310, a second threshold voltage adjustment region 240 is formed in the second portion 315, and a third threshold voltage adjustment region 245 is formed in the third portion 320.

The impurities of the first conductivity 325 may be n-type impurities, such as phosphorous (P) or arsenic (As), for example. A reset gate 257 of FIG. 12, a drive gate 267 of FIG. 12, and a selection gate 277 of FIG. 12 to be subsequently formed on the first, second, and the third portions 310, 315, and 320 can be formed to have the same threshold voltage $V_{th,d}$. In addition, the first, second, and third threshold voltage adjustment regions 235, 240, and 245 doped with the n-type impurities may be formed in the p-type well 225 to lower the threshold voltages $V_{th,d}$ of the first, second, and third threshold voltage adjustment regions 235, 240, and 245 closer to zero.

In FIGS. 8 and 9, the first, second, and third threshold voltage adjustment regions 235, 240, and 245 are formed simultaneously. In alternate embodiments, two threshold voltage adjustment regions may be formed first and then the remaining threshold voltage adjustment region may be formed later. For example, another photoresist pattern exposing the first and second portions 310 and 315 may be formed. Then, using the photoresist pattern as a protective layer for ion implantation, the impurities of the first conductivity 325 are ion-implanted into the entire surface of the resultant structure having photoresist pattern to form the first and second threshold voltage adjustment regions 235 and 240.

Next, another photoresist pattern exposing the third portion 320 is formed. Using the photoresist pattern as a protective layer for ion implantation, the impurities of the first conductivity 325 are ion-implanted into the entire surface of the resultant structure having the first and second threshold voltage adjustment regions 235 and 240 to form the third threshold voltage adjustment region 245.

Before or after the photoresist pattern 305 is formed, a photodiode (not shown) may be formed in the active region 220. The photodiode may be fabricated to have a first conductive impurity region and a second conductive impurity region under the first conductive impurity region. The first conductive impurity region may be formed of p-type impurities, and the second conductive impurity region may be formed of n-type impurities.

Figure 10:
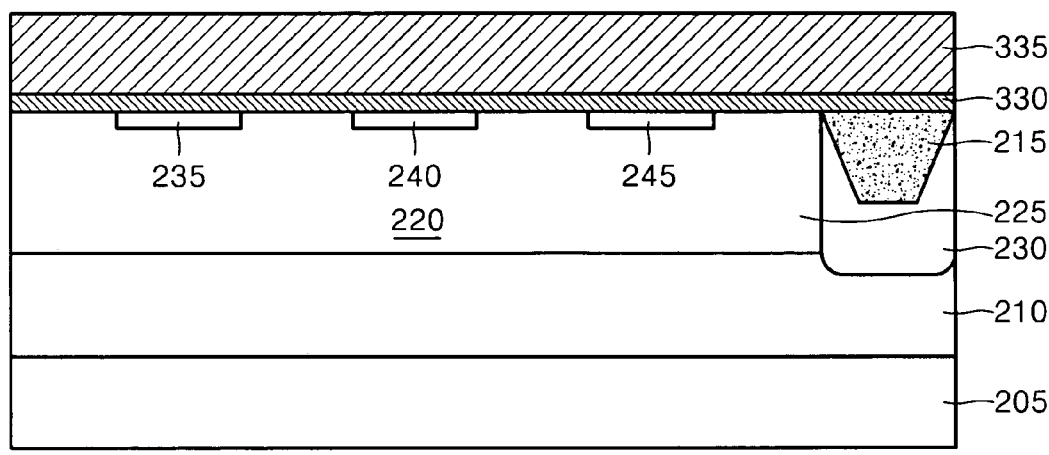

Referring to FIG. 10, the photoresist pattern 305 is removed, and a gate insulating layer 330 and a gate electrode layer 335 are sequentially formed on the active region including the first, second, and third threshold voltage adjustment regions 235, 240, and 245. The gate insulating layer 330 may be formed of a thermal oxide, a chemical vapor deposition oxide layer, or a chemical vapor deposition nitride, for example. The gate electrode layer 335 may be formed of polysilicon, tungsten (W), titanium nitride (TiN), tantalum (Ta) or tantalum nitride (TaN), or a combination of the same, for example.

Figure 11:
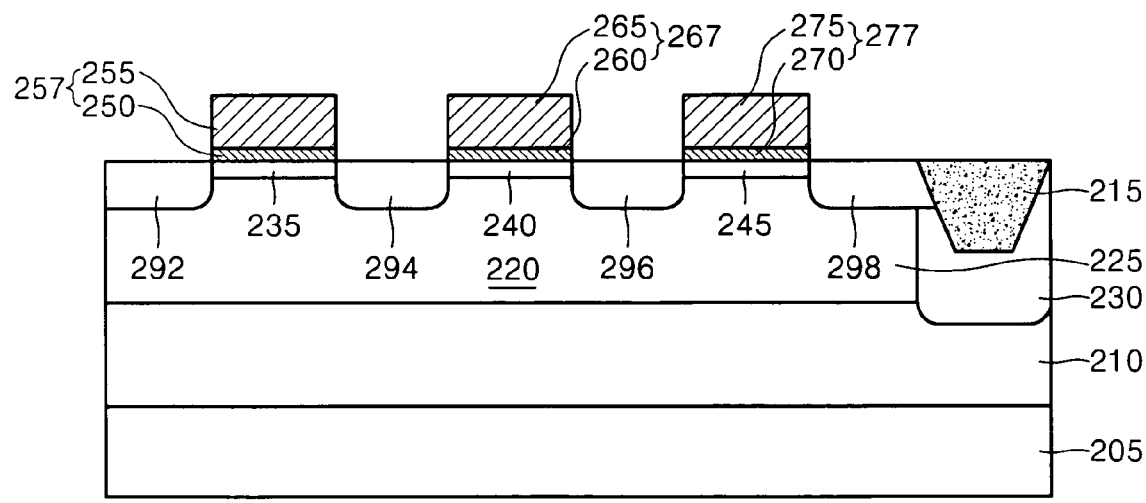

Referring to FIG. 11, the gate insulating layer 330 and the gate electrode layer 335 are patterned to form the reset gate 257 on the first portion 310, the drive gate 267 on the second portion 315, and the selection gate 277 on the third portion 320. The patterning may be performed using conventional photolithography and etching technologies. The reset gate 257, the drive gate 267, and the selection gate 277 include gate insulating layers 250, 260 and 270, and gate electrodes 255, 265 and 275, respectively.

Although the reset gate 257, the drive gate 267, and the selection gate 277 are sequentially arranged in a gate structure illustrated in FIG. 11, the gate structure may be easily modified by those of ordinary skill in the pertinent art. For example, in alternate embodiments the arrangement of the first, second, and third portions 310, 315, and 320 in the active region 220 may be changed to form a gate structure in which the reset gate 257, the selection gate 277, and the drive gate 267 are sequentially arranged.

Sources 292 and 296 and drains 294 and 298 are formed in the active region 220, interposing the reset gate 257, the selection gate 277, and the drive gate 267 therebetween. For example, the sources 292 and 296 and the drains 294 and 298 may be formed by ion-implanting the impurities of the first conductivity, such as the n-type impurities, for example, into the surface of the resultant structure having the reset gate 257, the drive gate 267, and the selection gate 277. At this time, the reset gate 257, the drive gate 267, and the selection gate 277 may be simultaneously doped with the n-type impurities. The sources 292 and 296 and the drains 294 and 298 are distinguished for convenience, but may be labeled oppositely.

According to a conventional method known to those of ordinary skill in the pertinent art, a light receiving lens and a wiring metal are added to complete the CMOS image sensor. In the method of fabricating the CMOS image sensor according to the present disclosure, the threshold voltages $V_{th}$ of the reset gate 257, the drive gate 267, and the selection gate 277 can be adjusted simultaneously by ion-implanting the impurities of the first conductivity 325 into a predetermined portion of the active region 220. In other words, it is economical to simultaneously form the reset gate 257 and the drive gate 267 as depletion transistors.

While the present invention has been particularly shown and described with reference to exemplary embodiments thereof, it will be understood by those of ordinary skill in the pertinent art that various changes in form and details may be made therein without departing from the spirit and scope of the present invention as defined by the following claims.

What is claimed is:

1. A complementary metal-oxide semiconductor (CMOS) image sensor comprising:
   a photodiode formed in a semiconductor substrate;
   a floating node formed in the semiconductor substrate and connected to the photodiode;
   a drive transistor comprising a gate formed on the semiconductor substrate and connected to the floating node, and a source and a drain formed in the semiconductor substrate and doped with impurities of first conductivity, one of which is connected to a supply voltage;
   a reset transistor comprising a source and a drain formed in the semiconductor substrate and doped with the impurities of the first conductivity, one of which is connected to the floating node; and
   a selection transistor comprising a source and a drain formed in the semiconductor substrate and doped with the impurities of the first conductivity, one of which is connected to the source or drain of the drive transistor,
   wherein the drive transistor comprises a threshold voltage adjustment region doped with the impurities of the first conductivity in a portion of the semiconductor substrate where a channel is formed.

2. The CMOS image sensor of claim 1, wherein the drive transistor is an n-type metal oxide semiconductor (NMOS) transistor, and the impurities of the first conductivity are n-type impurities.

3. The CMOS image sensor of claim 1, wherein each of the reset transistor and the selection transistor comprises a threshold voltage adjustment region doped with the first impurities in the portion of the semiconductor substrate where the channel is formed.

4. The CMOS image sensor of claim 3, wherein the reset transistor and the selection transistor are the NMOS transistors, and the impurities of the first conductivity are the n-type impurities.

5. The CMOS image sensor of claim 3, wherein the reset transistor, the drive transistor, and the selection transistor have a substantially identical threshold voltage.

6. The CMOS image sensor of claim 3, wherein the reset transistor, the drive transistor, and the selection transistor are depletion transistors when a bias voltage is not applied to the semiconductor substrate.

7. The CMOS image sensor of claim 1, wherein:
   the drive transistor is a depletion-mode transistor;
   the reset transistor comprises a second threshold voltage adjustment region doped with the impurities of the first conductivity in a portion of the semiconductor substrate where a channel is formed;
   the selection transistor comprises a third threshold voltage adjustment region doped with the impurities of the first conductivity in a portion of the semiconductor substrate where a channel is formed; and the first, second, and third threshold voltage adjustment regions are doped with n-type impurities and formed in a p-type well to lower the threshold voltages of the first, second, and third threshold voltage adjustment regions closer to zero.

8. A CMOS image sensor comprising:
a photodiode formed in a semiconductor substrate;
a floating node formed in the semiconductor substrate and connected to the photodiode;
a drive transistor comprising a gate formed on the semiconductor substrate and connected to the floating node, and a source and a drain formed in the semiconductor substrate and doped with impurities of a first conductivity;
a reset transistor comprising a source and a drain formed in the semiconductor substrate and doped with the impurities of the first conductivity, one of which is connected to the floating node; and
a selection transistor comprising a source and a drain and formed in the semiconductor substrate and doped with the impurities of the first conductivity, one of which is connected to the source or drain of the drive transistor and the other of which is connected to a supply voltage,
wherein the drive transistor comprises a threshold voltage adjustment region doped with the impurities of the first conductivity in a portion of the semiconductor substrate where a channel is formed.

9. The CMOS image sensor of claim 8, wherein the drive transistor is an NMOS transistor, and the impurities of the first conductivity are n-type impurities.

10. The CMOS image sensor of claim 8, wherein each of the reset transistor and the selection transistor comprises a threshold voltage adjustment region doped with the first impurities in the portion of the semiconductor substrate where the channel is formed.

11. The CMOS image sensor of claim 10, wherein the reset transistor and the selection transistor are NMOS transistors, and the impurities of the first conductivity are the n-type impurities.

12. The CMOS image sensor of claim 10, wherein the reset transistor, the drive transistor, and the selection transistor have a substantially identical threshold voltage.

13. The CMOS image sensor of claim 10, wherein the reset transistor, the drive transistor, and the selection transistor are depletion transistors when a bias voltage is not applied to the semiconductor substrate.

14. The CMOS image sensor of claim 8, wherein:
the drive transistor is a depletion-mode transistor;
the reset transistor comprises a second threshold voltage adjustment region doped with the impurities of the first conductivity in a portion of the semiconductor substrate where a channel is formed;
the selection transistor comprises a third threshold voltage adjustment region doped with the impurities of the first conductivity in a portion of the semiconductor substrate where a channel is formed; and
the first, second, and third threshold voltage adjustment regions are doped with n-type impurities and formed in a p-type well to lower the threshold voltages of the first, second, and third threshold voltage adjustment regions closer to zero.

15. A method of fabricating a CMOS image sensor, the method comprising:
forming a device isolation region defining an active region in a semiconductor substrate;
forming a first threshold voltage adjustment region in a first portion of the active region, forming a second threshold voltage adjustment region in a second portion of the active region, and forming a third threshold voltage adjustment region in a third portion of the active region; and
forming a reset gate on the first portion, forming a drive gate on the second portion, and forming a selection gate on the third portion,
wherein the first, second, and third threshold voltage adjustment regions are formed simultaneously, and
wherein, after a photoresist pattern exposing the first, second, and third portions of the active region is formed, impurities of a first conductivity are ion-implanted into the entire surface of the resulting structure having the photoresist pattern using the photoresist pattern as a protective layer to form the first, second, and third threshold voltage adjustment regions.

16. The method of claim 15, wherein the impurities of the first conductivity are n-type impurities.

17. The method of claim 15, further comprising forming a deep second conductive well in the active region before the first threshold voltage adjustment region is formed.

18. The method of claim 17, wherein the deep second conductive well is a p-type well.

19. The method of claim 15, wherein the reset gate, the drive gate, and the selection gate are simultaneously formed by forming a gate insulating layer on the semiconductor substrate, forming a gate electrode layer on the gate insulating layer, and patterning the gate insulating layer and the gate electrode layer.

20. A method of fabricating a CMOS image sensor, the method comprising:
forming a device isolation region defining an active region in a semiconductor substrate;
forming a first threshold voltage adjustment region in a first portion of the active region, forming a second threshold voltage adjustment region in a second portion of the active region, and forming a third threshold voltage adjustment region in a third portion of the active region; and
forming a reset gate on the first portion, forming a drive gate on the second portion, and forming a selection gate on the third portion,
wherein the first and second threshold voltage adjustment regions are formed simultaneously, and
wherein the first, second, and third threshold voltage adjustment regions are doped with n-type impurities and formed in a p-type well to lower the threshold voltages of the first, second, and third threshold voltage adjustment regions closer to zero.

21. The method of claim 20, wherein the first, second, and third threshold voltage adjustment regions are formed simultaneously.

22. The method of claim 20, wherein the reset gate, the drive gate, and the selection gate are simultaneously formed by forming a gate insulating layer on the semiconductor substrate, forming a gate electrode layer on the gate insulating layer, and patterning the gate insulating layer and the gate electrode layer.

* * * * *